(12) United States Patent
Cao et al.

(10) Patent No.: US 9,583,443 B2
(45) Date of Patent: Feb. 28, 2017

(54) METHOD FOR DISPLAYING POSITION OF ALIGNMENT MARK, ARRAY SUBSTRATE AND MANUFACTURING METHOD THEREOF

(71) Applicants: BOE Technology Group Co., Ltd., Beijing (CN); Hefei Xinsheng Optoelectronics Technology Co., Ltd., Anhui (CN)

(72) Inventors: Binbin Cao, Beijing (CN); Yinhu Huang, Beijing (CN); Chengshao Yang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/098,456

(22) Filed: Apr. 14, 2016

(65) Prior Publication Data

US 2016/0336273 A1 Nov. 17, 2016

(30) Foreign Application Priority Data

May 13, 2015 (CN) .......................... 2015 1 0243709

(51) Int. Cl.
*H01L 29/15* (2006.01)
*H01L 23/544* (2006.01)
*H01L 27/12* (2006.01)

(52) U.S. Cl.
CPC ........ *H01L 23/544* (2013.01); *H01L 27/1218* (2013.01); *H01L 27/1262* (2013.01); *H01L 2223/54426* (2013.01)

(58) Field of Classification Search
CPC ............... H01L 23/544; H01L 27/1218; H01L 27/1262; H01L 2223/54426
USPC .................................................. 257/72, 797
See application file for complete search history.

(56) References Cited

U.S. PATENT DOCUMENTS 9,204,134 B2 * 12/2015 Matsumoto ........ H04N 13/0409
9,337,248 B2 * 5/2016 Youk ................... H01L 27/3272

* cited by examiner

*Primary Examiner* — Tu-Tu Ho
(74) *Attorney, Agent, or Firm* — Banner & Witcoff, Ltd.

(57) ABSTRACT

A method for displaying a position of an alignment mark, an array substrate and a manufacturing method thereof are provided. The method for displaying the position of the alignment mark includes: forming an alignment mark on a surface of a base substrate; forming a first isolation layer covering the alignment mark; forming a via hole in the first isolation layer to expose the alignment mark; applying a first material in the via hole to form a first material pattern; and applying a second material on surfaces of the first material pattern and the first isolation layer to form a second material film, wherein the first material and the second material are configured to have different polarities, so that the second material cannot be attached to the first material pattern.

19 Claims, 3 Drawing Sheets

METHOD FOR DISPLAYING POSITION OF ALIGNMENT MARK, ARRAY SUBSTRATE AND MANUFACTURING METHOD THEREOF

This application claims priority to and the benefit of Chinese Patent Application No. 201510243709.9 filed on May 13, 2015, which application is incorporated herein in its entirety.

TECHNICAL FIELD

Embodiments of the present disclosure relate to a method for displaying a position of an alignment mark, an array substrate and a manufacturing method thereof.

BACKGROUND

In existing liquid crystal display panels, a Color filter On Array (COA) technology has been known, which can improve an aperture opening ratio of the liquid crystal display panels so as to improve brightness and image quality of the liquid crystal display panels. A manufacturing process of such an array substrate includes steps of: S1: forming an alignment mark and a thin film transistor on a surface of a base substrate, and forming a first isolation layer on the alignment mark, the thin film transistor and the base substrate; S2: coating a black matrix material on a surface of the first isolation layer to form a black matrix material film, i.e., covering the alignment mark with the first isolation layer and the black matrix material film, so that the alignment mark is covered by the first isolation layer and the black matrix material film and the position of the alignment mark cannot be displayed; and S3: by an exposure machine, carrying out alignment according to the alignment mark and carrying out exposure on the black matrix material film to form a black matrix pattern aligned with other patterns in previous processes. Alignment between the existing exposure machine and the alignment mark adopts a light transmission mode. Due to high optical density of the black matrix material film, the exposure machine cannot clearly identify the alignment mark under the black matrix material film.

SUMMARY

One embodiment of the present disclosure provides a method for displaying a position of an alignment mark, comprising: forming an alignment mark on a surface of a base substrate; forming a first isolation layer covering the alignment mark; forming a via hole in the first isolation layer to expose the alignment mark; applying a first material in the via hole to form a first material pattern; and applying a second material on surfaces of the first material pattern and the first isolation layer to form a second material film, wherein the first material and the second material are configured to have different polarities, so that the second material cannot be attached to the first material pattern.

Another embodiment of the present disclosure provides a manufacturing method of an array substrate, comprising: forming an alignment mark and a thin film transistor on a surface of a base substrate; forming a first isolation layer covering the alignment mark, the thin film transistor and the base substrate; forming a via hole in the first isolation layer to expose the alignment mark; applying a first material in the via hole to form a first material pattern; and applying a second material on surfaces of the first material pattern and the first isolation layer to form a second material film, wherein the first material and the second material are configured to have different polarities, so that the second material cannot be attached to the first material pattern.

Another embodiment of the present disclosure provides an array substrate, comprising: a base substrate; an alignment mark and a thin film transistor which are formed on a surface of the base substrate; a first isolation layer which is formed on the thin film transistor and the base substrate and is provided with a via hole exposing the alignment mark; a first material pattern positioned in the via hole; and a second material film positioned on the isolation layer, wherein a first material of the first material pattern and a second material of the second material film are configured to have different polarities, so that the second material cannot be attached to the first material pattern.

BRIEF DESCRIPTION OF THE DRAWINGS

In order to more clearly illustrate the technical solution of the embodiments of the present disclosure, the drawings of the embodiments will be briefly described in the followings, and it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

First Embodiment

Figure 1:
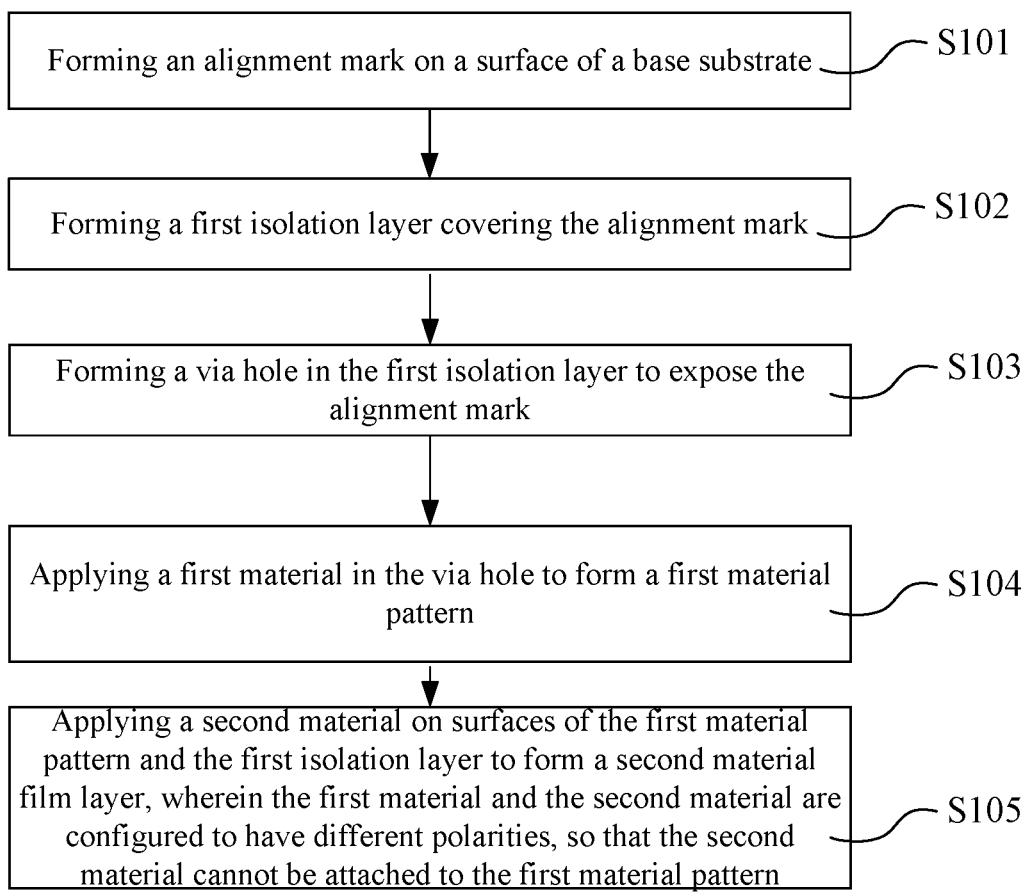
FIG. 1 is a flow chart of a method for displaying a position of an alignment mark according to one embodiment of the present disclosure.

According to one embodiment of the present disclosure, a method for displaying a position of an alignment mark, as illustrated in FIG. 1, includes steps of: S101: forming an alignment mark on a first board surface of a base substrate; S102: forming a first isolation layer covering the alignment mark; S103: forming a via hole in the first isolation layer to expose the alignment mark; S104: applying a first polar coating in the via hole to form a first polar coating pattern; and S105: applying a second polar coating, which cannot be attached to a surface of the first polar coating, on surfaces of the first polar coating pattern and the first isolation layer to form a second polar coating film.

The first polar coating and the second polar coating are two materials with different polarities. The cases that the first polar coating and the second polar coating have different polarities can include: one of the two coatings is a polar material and the other of the two coatings is a non-polar material; or both the two coatings are polar materials and the two coatings are different in polarity degree.

For example, materials for the two coatings differ in surface energy by at least 10 mN/m, which enables a second coating pattern not to be attached to the first polar coating in the applying process of the second polar coating.

In the method for displaying the position of the alignment mark according to the present embodiment, the alignment mark is formed on the first board surface of the base substrate and is positioned in the via hole of the first isolation layer; the first polar coating is applied in the via hole to form the first polar coating pattern; and the surfaces of the first polar coating pattern and the first isolation layer are coated with the second polar material which cannot be attached to the surface of the first polar coating so as to form the second polar coating film. Therefore, the alignment mark is covered by the first polar coating pattern, but due to no second polar material on the surface of the first polar coating pattern and formation of the second polar coating film at a position on the surface of the first isolation layer other than the via hole, a boundary is formed between the second polar material film and the first polar coating pattern and the position of the alignment mark can be displayed through the boundary.

In some examples, the first polar coating is a hydrophilic coating and the second polar material is a hydrophobic material.

For example, in order to further enable the second polar coating not to be attached to the surface of the first polar coating, the first polar coating adopts a super-hydrophilic coating and has a continuous hydrophilic angle smaller than 5 degrees, a primary particle size of 5 to 50 nanometers and a specific surface area of over 200 square meters per gram. Therefore, a probability that the second polar coating is attached to the surface of the first polar coating pattern is smaller, the boundary formed between the second polar coating film and the first polar coating pattern is clearer, and the position of the alignment mark can be more clearly displayed.

In some examples, the first polar coating is flowing emulsion prepared by modifying and compounding multi-component nano-units, such as nano-carbon dioxide, carbon nano-tubes and the like, has the continuous hydrophilic angle smaller than 5 degrees, the primary particle size of 5 to 50 nanometers and the specific surface area of over 200 square meters per gram.

Second Embodiment

Figure 2:
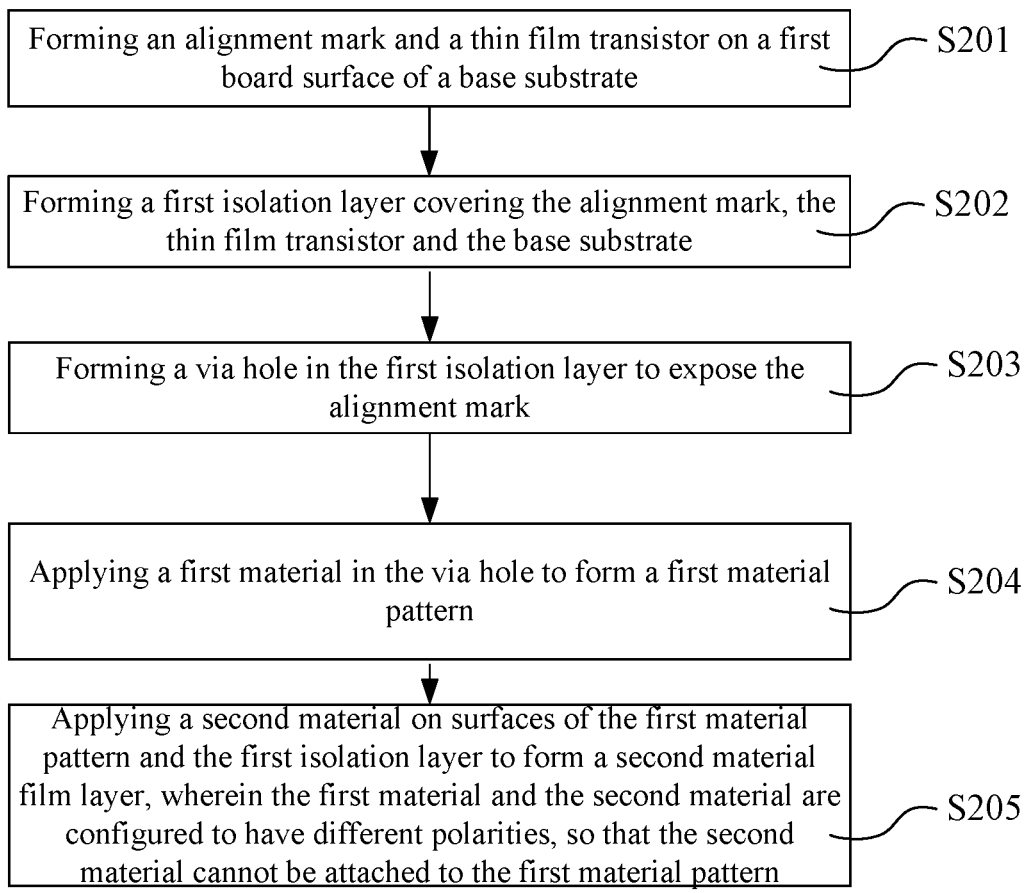
FIG. 2 is a flow chart of a manufacturing method of an array substrate according to one embodiment of the present disclosure.
Figure 3:
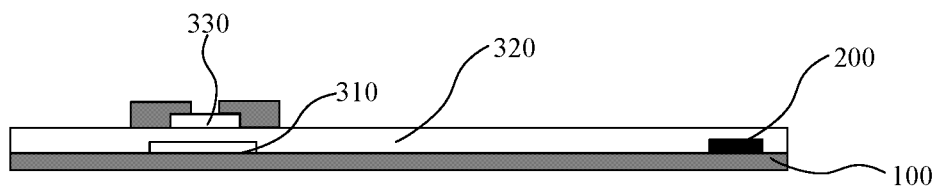
FIG. 3 is a schematic diagram of forming an alignment mark and a thin film transistor on a first board surface of a base substrate as illustrated in FIG. 2.
Figure 4:
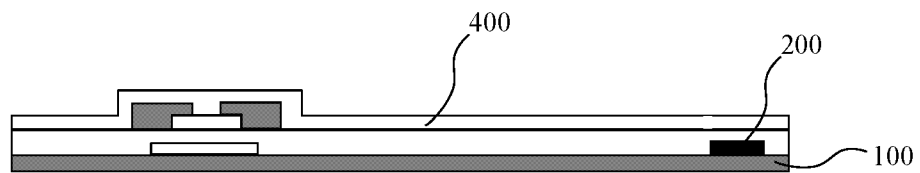
FIG. 4 is a schematic diagram of forming a first isolation layer covering the alignment mark, the thin film transistor and the base substrate as illustrated in FIG. 2.
Figure 5:
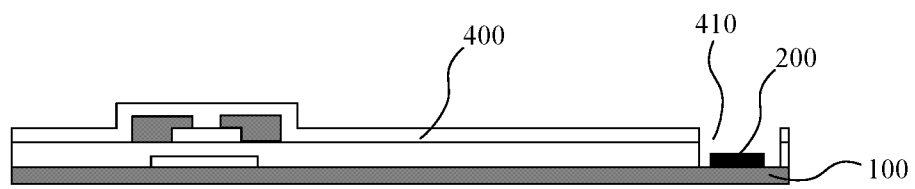
FIG. 5 is a schematic diagram of forming a via hole in the first isolation layer to expose the alignment mark as illustrated in FIG. 2.
Figure 6:
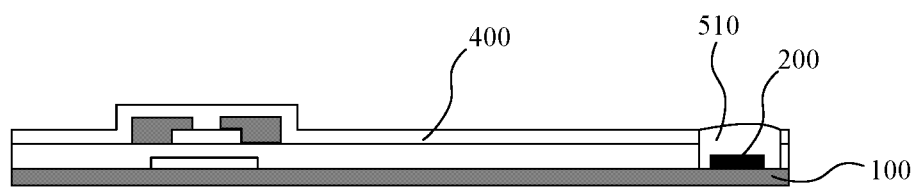
FIG. 6 is a schematic diagram of coating a first polar coating in the via hole to form a first polar coating pattern as illustrated in FIG. 2.
Figure 7:
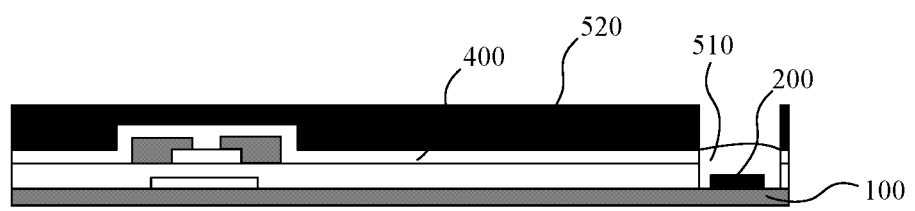
FIG. 7 is a schematic diagram of applying a second polar black matrix material, which cannot be attached to a surface of the first polar coating, on surfaces of the first polar coating pattern and the first isolation layer to form a second polar black matrix coating film as illustrated in FIG. 2.

According to the second embodiment of the present disclosure, a manufacturing method of an array substrate, as illustrated in FIG. 2, includes steps of: S201: as illustrated in FIG. 3, forming an alignment mark 200 and a thin film transistor on a first board surface of a base substrate 100; S202: as illustrated in FIG. 4, forming a first isolation layer 400 covering the alignment mark 200, the thin film transistor and the base substrate; S203: as illustrated in FIG. 5, forming a via hole 410 in the first isolation layer 400 to expose the alignment mark 200; S204: as illustrated in FIG. 6, applying a first polar coating in the via hole 410 to form a first polar coating pattern 510; S205: as illustrated in FIG. 7, applying a second polar black matrix material, which cannot be attached to a surface of the first polar coating, on surfaces of the first polar coating pattern 510 and the first isolation layer 400 to form a second polar black matrix coating film 520.

In the manufacturing method of the array substrate according to the present embodiment, the alignment mark is formed on the first board surface of the substrate and is positioned in the via hole of the first isolation layer; the first polar coating is applied in the via hole to form the first polar coating pattern; and the surfaces of the first polar coating pattern and the first isolation layer are coated with the second polar black matrix material which cannot be attached to the surface of the first polar coating so as to form the second polar black matrix coating film. Therefore, the alignment mark is covered by the first polar coating pattern and the second polar black matrix material has high optical density, however, no second polar black matrix material is attached to the surface of the first polar coating pattern, no covering effect is taken on the alignment mark and the first polar coating pattern, and the second polar black matrix material is only attached to a position on the surface of the first isolation layer other than the via hole to form the second polar black matrix coating film, and thus, a boundary is formed between the second polar black matrix coating film and the first polar coating pattern and the position of the alignment mark can be displayed through the boundary. Therefore, conditions are provided for an exposure machine to rapidly and conveniently find the position of the alignment mark.

The first polar coating and the second polar coating are two materials with different polarities. The cases that the first polar coating and the second polar coating have different polarities can include: one of the two coatings is a polar material and the other of the two coatings is a non-polar material; or both the two coatings are polar materials and the two coatings are different in polarity degree.

For example, materials for the two coatings differ in surface energy by at least 10 mN/m, which enables a second coating pattern not to be attached to the first polar coating in the coating process of the second polar coating.

In some examples, the first polar coating adopts a hydrophilic coating and the second polar black matrix material adopts a hydrophobic black matrix material.

For example, in order to further enable the second polar black matrix coating not to be attached to the surface of the first polar coating, the hydrophilic coating is a super-hydrophilic coating and has a continuous hydrophilic angle smaller than 5 degrees, a primary particle size of 5 to 50 nanometers and a specific surface area of over 200 square meters per gram. Therefore, a probability that the second polar coating is attached to the surface of the first polar coating pattern is smaller, the boundary formed between the second polar black matrix coating film and the first polar coating pattern is clearer, and the position of the alignment mark can be more clearly displayed.

In some examples, the first polar coating is flowing emulsion prepared by modifying and compounding multi-component nano units, such as nano carbon dioxide, carbon nano tubes and the like, has the continuous hydrophilic angle smaller than 5 degrees, the primary particle size of 5 to 50 nanometers and the specific surface area of over 200 square meters per gram.

The manufacturing method of the array substrate, after the position of the alignment mark is displayed, further includes steps of: by the exposure machine, identifying the alignment mark through the first polar coating, carrying out alignment according to the alignment mark and carrying out exposure on the black matrix material to form a black matrix pattern, wherein the first polar coating is a hydrophilic coating that light emitted by the exposure machine can transmit; and pixels are formed in a space formed by the black matrix pattern, and the pixels are formed with a color film. Therefore, the array substrate with the color film is manufactured.

In some examples, in the manufacturing method of the array substrate, after the second polar black matrix material is coated, low-pressure drying can be carried out to enable a solvent of the second polar black matrix material to be volatilized, at the moment, the first polar coating also can be volatilized, and a small amount of solid matter is left; after exposure, development is carried out, and the solid matter is dissolved due to hydrophily, and thus, the first polar material is removed in the whole exposure process.

In some examples, forming the thin film transistor on the first board surface of the base substrate includes steps of: as illustrated in FIG. 7, forming a gate electrode 310, which is in a same layer with the alignment mark, on the first board surface of the base substrate; forming a gate insulating layer 320 covering the gate electrode 310, the alignment mark 200 and the base substrate; forming an active layer 330 at a position above the gate electrode 320 on a surface of the gate insulating layer 320; and forming a source electrode and a drain electrode, which are bridged on a surface of the active layer, on the surfaces of the active layer 330 and the gate insulating layer 320, wherein the first isolation layer 400 covers the source electrode, the drain electrode, the active layer 330 and the gate insulating layer 320.

It should be noted that the specific steps of forming the thin film transistor on the first board surface of the base substrate are only used for illustration and not intended to limit the specific method, as long as the thin film transistor can be formed.

In a manufacturing process of a liquid crystal display panel, a region where the alignment mark is positioned can be cut off.

Some embodiments of the present disclosure provide an array substrate, including: a base substrate; an alignment mark and a thin film transistor which are formed on a surface of the base substrate; a first isolation layer which is formed on the thin film transistor and the base substrate and is provided with a via hole exposing the alignment mark; a first material pattern positioned in the via hole; and a second material film positioned on the isolation layer, wherein a first material of the first material pattern and a second material of the second material film are configured to have different polarities, so that the second material cannot be attached to the first material pattern.

In some examples, the first material and the second material have different polarities, including: one of the first material and the second material is a polar material and the other of the first material and the second material is a non-polar material; or both the first material and the second material are polar materials and the first material and the second material are different in polarity degree.

In some examples, the first material and the second material differ in surface energy by at least 10 mN/m.

In some examples, the first material is a hydrophilic coating and the second material is a hydrophobic black matrix material.

In some examples, the hydrophilic coating is a super-hydrophilic coating and has a continuous hydrophilic angle smaller than 5 degrees, a primary particle size of 5 to 50 nanometers and a specific surface area of over 200 square meters per gram.

In some examples, the alignment mark and a gate electrode of the thin film transistor are positioned in a same layer.

The foregoing embodiments merely are exemplary embodiments of the disclosure, and not intended to define the scope of the disclosure, and the scope of the disclosure is determined by the appended claims.

The application claims priority of Chinese Patent Application No. 201510243709.9 filed on May 13, 2015, the disclosure of which is incorporated herein by reference in its entirety as part of the present application.

The invention claimed is:

1. A method for displaying a position of an alignment mark, comprising:
   forming an alignment mark on a surface of a base substrate;
   forming a first isolation layer covering the alignment mark;
   forming a via hole in the first isolation layer to expose the alignment mark;
   applying a first material in the via hole to form a first material pattern; and
   applying a second material on surfaces of the first material pattern and the first isolation layer to form a second material film, wherein the first material and the second material are configured to have different polarities, so that the second material cannot be attached to the first material pattern.

2. The method for displaying the position of the alignment mark according to claim 1, wherein the first material and the second material have different polarities, including:
   one of the first material and the second material is a polar material, and the other of the first material and the second material is a non-polar material; or
   both the first material and the second material are polar materials, and the first material and the second material are different in polarity degree.

3. The method for displaying the position of the alignment mark according to claim 1, wherein the first material and the second material differ in surface energy by at least 10 mN/m.

4. The method for displaying the position of the alignment mark according to claim 1, wherein the first material is a hydrophilic coating and the second material is a hydrophobic black material.

5. The method for displaying the position of the alignment mark according to claim 4, wherein the hydrophilic coating is a super-hydrophilic coating and has a continuous hydrophilic angle smaller than 5 degrees, a primary particle size of 5 to 50 nanometers and a specific surface area of over 200 square meters per gram.

6. A manufacturing method of an array substrate, comprising:
   forming an alignment mark and a thin film transistor on a surface of a base substrate;
   forming a first isolation layer covering the alignment mark, the thin film transistor and the base substrate;
   forming a via hole in the first isolation layer to expose the alignment mark;

applying a first material in the via hole to form a first material pattern; and applying a second material on surfaces of the first material pattern and the first isolation layer to form a second material film, wherein the first material and the second material are configured to have different polarities, so that the second material cannot be attached to the first material pattern.

7. The manufacturing method of the array substrate according to claim 6, wherein the first material and the second material have different polarities, including:
one of the first material and the second material is a polar material, and the other of the first material and the second material is a non-polar material; or
both the first material and the second material are polar materials, and the first material and the second material are different in polarity degree.

8. The manufacturing method of the array substrate according to claim 6, wherein the first material and the second material differ in surface energy by at least 10 mN/m.

9. The manufacturing method of the array substrate according to claim 8, wherein the first material is a hydrophilic coating and the second material is a hydrophobic black matrix material.

10. The manufacturing method of the array substrate according to claim 9, wherein the hydrophilic coating is a super-hydrophilic coating and has a continuous hydrophilic angle smaller than 5 degrees, a primary particle size of 5 to 50 nanometers and a specific surface area of over 200 square meters per gram.

11. The manufacturing method of the array substrate according to claim 9, wherein the first material is a hydrophilic coating that light emitted by an exposure machine can transmit through; and
the manufacturing method of the array substrate further includes a step of:
identifying, by the exposure machine, the alignment mark through the first material, carrying out alignment according to the alignment mark and carrying out exposure on the hydrophobic black matrix material to form a black matrix pattern.

12. The manufacturing method of the array substrate according to claim 11, further comprising:
forming pixels in a space enclosed by the black matrix pattern.

13. The manufacturing method of the array substrate according to claim 6, wherein forming the thin film transistor on the surface of the base substrate includes:

forming a gate electrode, which is on a same layer with the alignment mark, on the surface of the base substrate;

forming a gate insulating layer covering the gate electrode, the alignment mark and the base substrate;

forming an active layer at a position above the gate electrode on a surface of the gate insulating layer; and forming a source electrode and a drain electrode on the active layer and the gate insulating layer; the first isolation layer covering the source electrode, the drain electrode, the active layer and the gate insulating layer.

14. An array substrate, comprising:
a base substrate;
an alignment mark and a thin film transistor which are formed on a surface of the base substrate;
a first isolation layer which is formed on the thin film transistor and the base substrate and is provided with a via hole exposing the alignment mark;
a first material pattern positioned in the via hole; and
a second material film positioned on the first isolation layer, wherein a first material of the first material pattern and a second material of the second material film are configured to have different polarities, so that the second material cannot be attached to the first material pattern.

15. The array substrate according to claim 14, wherein the first material and the second material have different polarities, including:
one of the first material and the second material is a polar material, and the other of the first material and the second material is a non-polar material; or
both the first material and the second material are polar materials, and the first material and the second material are different in polarity degree.

16. The array substrate according to claim 14, wherein the first material and the second material differ in surface energy by at least 10 mN/m.

17. The array substrate according to claim 14, wherein the first material is a hydrophilic coating and the second material is a hydrophobic black matrix material.

18. The array substrate according to claim 17, wherein the hydrophilic coating is a super-hydrophilic coating and has a continuous hydrophilic angle smaller than 5 degrees, a primary particle size of 5 to 50 nanometers and a specific surface area of over 200 square meters per gram.

19. The array substrate according to claim 14, wherein the alignment mark and a gate electrode of the thin film transistor are positioned in a same layer.

* * * * *